United States Patent [19]

Kuhn et al.

[11] Patent Number: 4,543,537
[45] Date of Patent: Sep. 24, 1985

[54] METHOD OF AND ARRANGEMENT FOR CONTROLLING THE GAIN OF AN AMPLIFIER

[75] Inventors: Michael H. Kuhn, Hamburg; Herbert Piotrowski, Oersdorf; Rudolf Geppert, Hamburg, all of Fed. Rep. of Germany

[73] Assignee: U.S. Philips Corporation, New York, N.Y.

[21] Appl. No.: 602,851

[22] Filed: Apr. 23, 1984

[30] Foreign Application Priority Data

Apr. 22, 1983 [DE] Fed. Rep. of Germany ....... 3314570

[51] Int. Cl.$^4$ .............................................. H03G 3/20
[52] U.S. Cl. ..................................... 330/129; 330/279
[58] Field of Search ................. 330/129, 278, 279, 282

[56] References Cited

U.S. PATENT DOCUMENTS 4,449,104  5/1984  Agnor et al. ........................ 330/129

Primary Examiner—James B. Mullins
Assistant Examiner—G. Wan
Attorney, Agent, or Firm—Thomas A. Briody; William J. Streeter; Edward W. Goodman

[57] ABSTRACT

For processing a signal applied to an input of audio signal processing devices, for example a speech signal received via a microphone (2) in a speaker-identification or speech recognition system, the signal must have a specific level. For this purpose the signal is applied via an amplifier (4) with variable gain. Before processing begins, the gain is set to an initial value. During processing of the speech signal, it is checked, at regular time intervals, in which range of a plurality of predetermined amplitude ranges the amplified signal is situated, and whether overloading takes place and the frequency which the amplitude of the signal occurs in each of the amplitude ranges is counted. When the signal ends, the optimum gain setting is determined from the histogram of frequencies. In the case of a signal which is specific of an individual speaker and which must be processed in speech recognition or speaker identification systems, this optimum gain setting may be stored in a memory (28) at a location assigned to the speaker, and when the system is subsequently used by the same speaker this value is used as the initial setting of the amplifier gain. In this way the gain is set to an optimum value during the first time that the system is used by a specific speaker and it is corrected continuously when the system is used again by the same speaker.

9 Claims, 2 Drawing Figures

METHOD OF AND ARRANGEMENT FOR CONTROLLING THE GAIN OF AN AMPLIFIER

BACKGROUND OF THE INVENTION

The invention relates to a method of controlling the gain of an amplifier, in particular for use in audio-signal-processing devices, a signal being applied to the amplifier and the output signal of the amplifier is digitized in an analog-to-digital converter. The invention also relates to an arrangement for carrying out the method.

Arrangements which process speech signals such as in particular speaker-identification systems and speech-recognition systems generally operate with a digitized speech signal. For this purpose the electrical analog speech signal must be applied from a microphone to an analog-to-digital converter, which converts the signal into a digital signal. Prior to its presentation to the converter, the speech signal from the microphone must be amplified to such an extent that the maximum range of said analog-to-digital converter is not, or hardly ever, exceeded and that the signal is not too small in comparison with the maximum range of the analog-to-digital converter. Since a speech-processing device is generally utilized by a multitude of persons who mostly speak with different loudnesses, an optimum drive of the analog-to-digital converter cannot be guaranteed if the gain of the amplifier, to which the speech signal from the microphone is applied, is fixed. For example, persons speaking in a loud voice may cause the maximum range of the converter to be exceeded, whereas persons speaking in a very soft voice produce a signal which may be partly drowned in the quantization of the converter.

In this respect it is to be noted that the scope of the invention is not limited to systems for speaker identification or speech recognition. Generally speaking, the invention may also be used in audio-signal-processing arrangements in general, such as, for example, audio cassette recorders and dictation equipment.

In order to adapt the gain factor of an amplifier to signals of different magnitude in such a way that a substantially unitary output signal is obtained, audio cassette recorders, for example, employ automatic gain control circuits of the analog type. However, these circuits have some drawbacks, namely their transient response in the case of loudness variations is generally very slow and, specifically, the gain during the recording of a speech signal is not constant. Especially if the conditions during recording of each signal must be well-defined and reproducible, the customary control circuits are unsatisfactory. However, for systems which process speech signals, such as automatic speaker identification systems and word-recognition systems, the conditions must be accurately reproducible. Automatic speaker identification systems generally employ a code word assigned to each individual speaker, for example a personal identification number, by means of which the speaker claims a specific identity. By means of the subsequently applied speech signal of this speaker it is verified whether the speaker actually has the identity claimed. Word-recognition systems are frequently also speaker-dependent i.e. before or when the speech-signal is applied it must be indicated which speaker is concerned. This need not necessarily be done by means of a number but it may also be effected by means of an acoustic signal. Moreover, in the case of speaker-identification and word-recognition systems used via the public telephone network, it is important to compensate for different degrees of attenuation.

SUMMARY OF THE INVENTION

It is an object of the invention to provide a method of controlling the gain of the amplifier, a signal being applied via an input, the gain of the amplifier arranged after the input being controlled so that the amplifier delivers a signal which is largely independent of loudness fluctuations and which drives an analog-to-digital converter in an optimum manner.

According to the invention this object is achieved in that (a) for a specific initial setting of the amplifier gain, a histogram is derived from the output of the converter, which histogram represents the frequency with which, within a specific period of time, the amplitude of the converter output signal occurs in each of different consecutive amplitude ranges.

(b) after the histogram has been formed, the frequency value for the highest amplitude range, which frequency value corresponds to the frequency with which a specific amplitude value is exceeded, is compared with a first constant, (c) if the first constant is found to be exceeded the gain is reduced by a predetermined first factor, (d) if the first constant is found not to be exceeded, frequency value for the second highest amplitude range is compared with a predetermined second constant, (e) if the second constant is found not to be exceeded, the frequency value for the third highest amplitude range is added to the frequency value for the second highest amplitude range and the resulting sum is compared with the second constant, (f) if the second constant is then found not to be exceeded, the following pair of operations is carried out and repeated (if necessary) until the new resulting sum exceeds the second constant, the frequency values for the successive next highest amplitude ranges being used for the successive repetitions if they occur: the frequency value for the next highest amplitude range is added to the last resulting sum obtained, and the new resulting sum is compared with the second constant, the method also being characterized in that the gain is increased by a predetermined second factor if operations (e) are carried out and it is found therein that the second constant is exceeded by the resulting sum, and the gain is increased by the second predetermined second factor to the power $(n+1)$ if operations (f) are carried out, where n is the number of times said pair of operations is carried out.

Preferably, the method is carried out in such a way that each time operation (c) is carried out, the sequence of operations returns to operation (a) using the gain resulting from the gain reduction performed in that operation (c) as the specific initial setting of the amplifier gain in the new operation (a), and wherein the method is terminated when it is found in a repeated operation (b) resulting from such a return that the frequency value for the first amplitude range obtained in the immediately preceding operation (a) does not exceed the first constant.

In the preferred method, the gain of the amplifier is reduced when the maximum range of the analog-to-digital converter is exceeded upon a first application of a signal, and the measurement must be repeated until the optimum gain setting is obtained. However, if the amplitude of the signal is too low in comparison with the maximum range of the analog-to-digital converter, the optimum gain setting can be obtained by applying the signal only once. So, if specific advance information about the magnitude of the signal amplitude is available, namely that outranging of the analog-to-digital converter can be precluded by only once a reduction of the gain, a repeated measurement is not necessary, so that in this case the method as defined in the principal Claim may be used.

For processing a signal which is specific of an individual speaker the method in accordance with the invention may further be characterized in that, either after the operation (c), when operation (b) is carried out only once, or when it is found in a said repeated operation (b) that the frequency value for the first amplitude range obtained in the immediately preceding operation (a) does not exceed the first constant, or when it is found in the operation (d) that the frequency value for the second highest amplitude range exceeds the second constant, or when it is found in the operations (e) or (f) that the second constant is exceeded by the resulting sum which is compared therewith, a quantity representative of the gain setting then present is stored in a memory at a location assigned to the specific speaker. This step is based on the recognition of the fact that a signal which is specific of an individual speaker is not only employed for further processing of the speech signal, for example for the identification of the speaker or for recognizing the words in the case of word recognition, but may also be employed for determining the initial setting of the amplifier gain during subsequent use of the method. When the speech-signal processing device is used for the first time by a person an average gain setting is selected. Once the optimum gain setting has been determined this value can be stored in a memory at a storage location assigned to the speaker because the speaker has entered a code word assigned to him.

During subsequent use of the speech-signal processing arrangement, the gain setting is recalled from the corresponding location of the memory upon entry of the code word and is employed for setting the gain before the speech signal is applied. Since the inventive method is applied during each use, long-term variations in the speech pattern are allowed for automatically.

The method can be simplified if the lower limits of each pair of consecutive amplitude ranges differ by a factor two and wherein the said predetermined second factor is equal to two. The factor two corresponds to one bit of the analog-to-digital converter, so that in this way the correct gain can be set with a minimal number of steps. Preferably, the first factor is equal to the second factor. In this way the variations in gain setting are equal in all cases.

An arrangement for carrying out the method is characterized in that there is provided a discriminator which when the signal amplitude occurs in the various amplitude ranges produces different intermediate signals, there is provided an accumulator which comprises a first memory, whose storage locations each correspond to an amplitude range and which increments the contents of the storage location in whose associated amplitude range the instantaneous signal is situated by one unit, after application of the signal a first comparator compares the contents of a first storage location, which contents correspond to the frequency for the first amplitude range, with the first constant and if this first constant is exceeded changes the contents of a gain-control memory so as to reduce the gain, there is provided a second accumulator which, if the first constant is not exceeded, transfers the contents of the second storage location, which corresponds to the frequency for the second amplitude range or the sum of the contents of the second and consecutive storage locations, to a second comparator for comparison with the second constant, after a comparison which indicates that at least the contents of the second storage location has not yet exceeded the second constant the second comparator changes the contents of the gain-control memory so as to increase the gain, and an output of the gain-control memory is connected to a control input of the amplifier for the application of a control signal.

This arrangement is suitable for universal use. For use in specific devices for word recognition or speaker identification the arrangement is further characterized in that there is further provided a second memory which serves to take over the contents of the gain-control memory in a storage location assigned to the speaker. Before a speech signal from the same speaker is applied the second memory then transfers the contents of the storage location assigned to this speaker to the gain-control memory as the initial gain setting.

DESCRIPTION OF THE DRAWINGS

The invention will now be described in more detail, by way of example, with reference to the accompanying drawings. In the drawings.

DESCRIPTION OF THE PREFERRED EMBODIMENT

Figure 1:
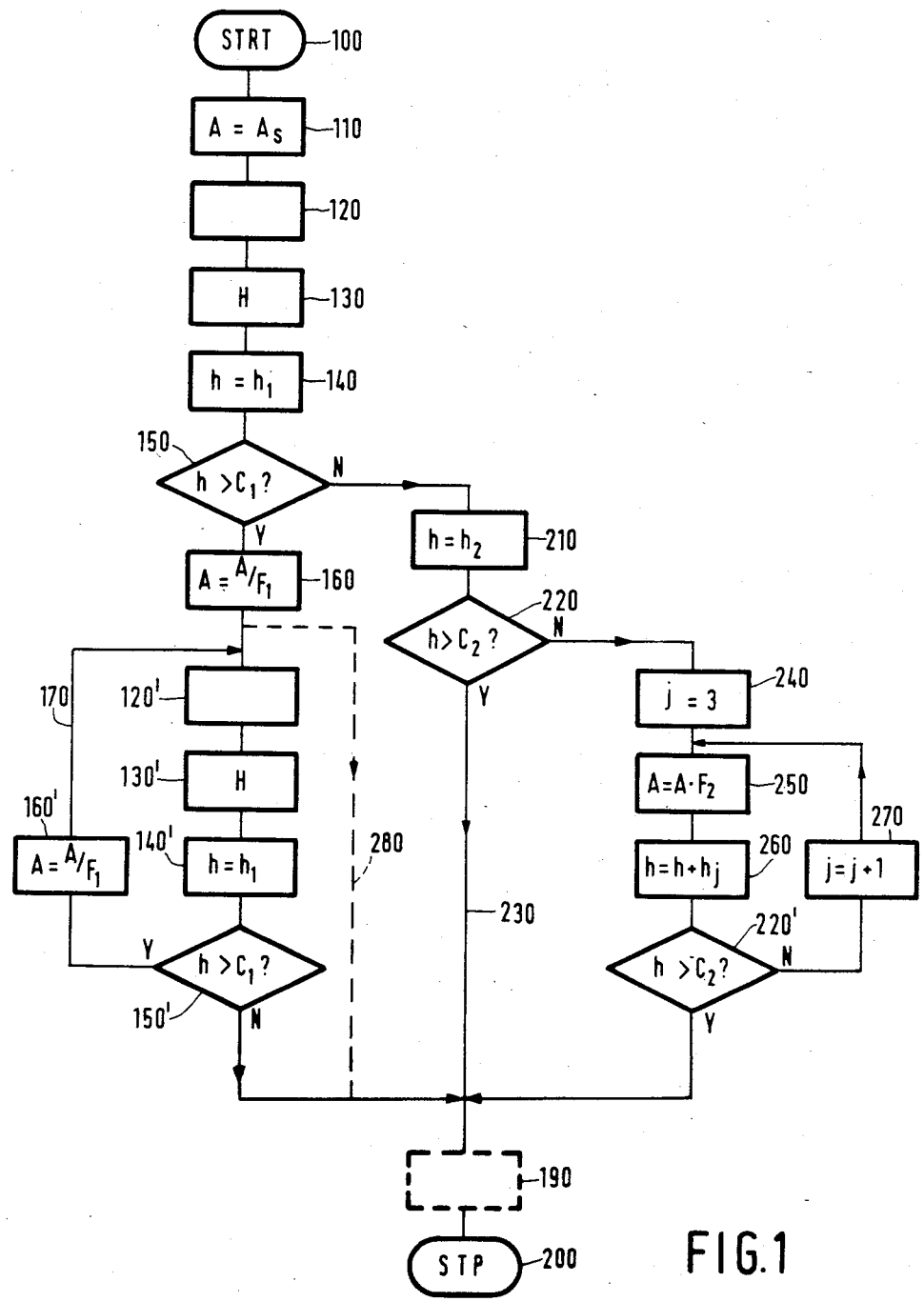
FIG. 1 is a flow chart diagramming the method in accordance with the invention.

The method starts in block 100 in FIG. 1. In block 110 the gain A is set to a specific initial value $A_s$ and stored in a memory. In block 120 a signal situated within a specific time interval is received. In block 130 a histogram H is formed which represents the frequency $h_i$ with which the amplitude of the signal occurs in each of different consecutive amplitude ranges i. In block 140 the frequency $h_1$ for the first amplitude range is determined. This first amplitude range is the highest amplitude range and $h_1$ corresponds to the frequency with which a specific amplitude is exceeded, namely the upper limit of the second (the next lower) amplitude range. In block 150 $h_1$ is compared with a predetermined first constant $C_1$. If $h_1$ is greater than $C_1$, i.e. when the signal was applied for the first time, this led to impermissible overloading, the gain A is reduced by a predetermined first factor $F_1$ in block 160 and the once reduced gain is stored. In the blocks following block 160, the application of a signal (block 120'), the formation of a histogram H (block 130') the comparison of the frequency $h_1$ (obtained in block 140') with $C_1$ (in block 150'), and the reduction followed by a storage of the gain (block 160') are repeated as long as $h_1$ is greater than $C_1$. Via line 170 and block 160' the process then proceeds from block 150' back to block 120'. If it is determined in block 150' that the constant is not exceeded, the gain then determined may be stored in a memory at a storage location assigned to a speaker. This takes place in block 190 (indicated by broken lines because this block is optional but not necessary). The method is then terminated in block 200.

If it is determined in block 150 that $h_1$ is smaller than or equal to $C_1$, the process is continued in block 210 and block 220. In block 220, $h_2$, the frequency for the second amplitude range, is compared with a second constant $C_2$. If $h_2 > C_2$ the method proceeds via line 230 to block 190 (if present) and is terminated in block 200.

If it is determined in block 220 that $h_2$ is smaller than or equal to $C_2$, the process proceeds with block 240. The gain A is increased by a second factor $F_2$ in block 250 and stored. In block 260 the frequency $h_3$ for the third amplitude range is added to $h_2$, and in block 220', the sum of the frequencies $h_2$ and $h_3$ is compared with $C_2$. If $h_2 + h_3 \leq C_2$, the frequency for consecutively lower amplitude ranges are added via blocks 270, 250 and 260 and the gain is again increased by the second factor $F_2$ and stored in block 250 until it is determined in block 220' that the resulting sum is greater than $C_2$. The method then continues via block 190 (if present). The storage of the gain in the blocks 110, 160, 160' and 250 is necessary to set the amplifier to the gain setting thus determined after the method has been carried out for further processing of the audio signal by the audio-signal processing arrangement. Obviously, it is then possible that after some time the method is repeated in order to adapt the gain of the amplifier (if necessary) to a changed average amplitude of the audio signal. The storage in the memory in block 190 (if present) enables the gain setting stored in block 110 to be used as an initial value when the method is repeated.

The method as described so far with reference to FIG. 1 may be employed if no advance information about the signal amplitude is available. However, if specific advance information about the amplitude is available, the program loop with the blocks 120', 130', 140', 150' and 160' may be dispensed with (as will be explained hereinafter). After the reduction of the gain by the first factor and the storage of the gain then obtained in block 160 the program then proceeds to block 190 (if present) via the line 280, indicated in broken lines.

Figure 2:
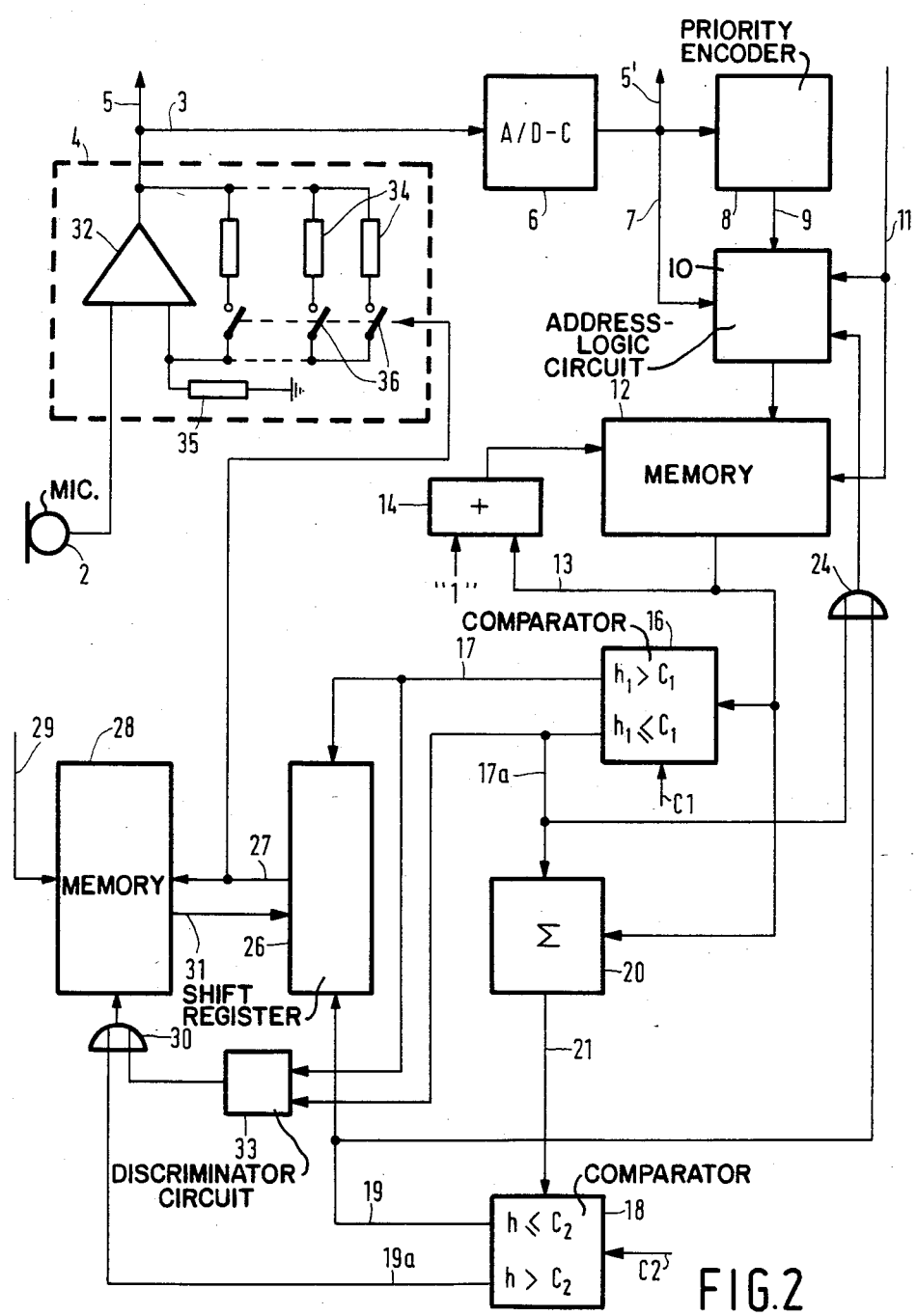
FIG. 2 shows an arrangement for carrying out the method.

FIG. 2 shows an arrangement for carrying out the method. This embodiment is particularly suitable for use in speech-signal processing arrangements for speaker or speech recognition. The signal received by the microphone 2 is applied to an amplifier 4, which comprises an amplifier stage 32 and a negative-feedback network for gain control, which network is represented by the resistors 34, the switches 36 and the resistor 35. The gain of the amplifier 4 is determined by the setting of the switches 36 and the values of the associated resistors 34 and the resistor 35. The individual resistors 34 have values which differ from each other, in such a manner that by closing the next switch 36 in the row the gain is reduced or increased by the factor 2. The signal appearing on the output of the amplifier 4 is applied to a speech-signal processing arrangement (not shown) via the line 5.

For determining the value to which the gain must be set the analog signal is applied to an analog-to-digital converter 6 via the line 3. As the speech-signal processing arrangement, not shown, generally requires digital input signals, the digital signal from the analog-to-digital converter 6 appearing on the line 7 may also be applied to said arrangement via the line 5'. As will be explained hereinafter, the line 7, the line 9 as well as the lines 13, 21 and 27 actually comprise a plurality of individual lines via which the bits of a digital word are transferred in parallel, but for simplicity they are shown as single lines.

The signal on the line 7 is applied to a priority encoder 8, which determines which is the highest bit position with the logic value "1". The number of this position is applied to an address-logic circuit 10 via the output 9. This circuit 10 converts the applied number into an address for the memory 12 in the following manner. Hereinafter it is assumed that the digital signal comprises eight bits. Obviously, the number of addresses is proportionally higher for a digital signal comprising more than eight bits.

| Highest bit position with logic "1" at position: | address: |
|---|---|
| 1 or 2 | 0 |
| 3 | 1 |
| 4 | 2 |
| 5 | 3 |
| 6 | 4 |
| 7 | 5 |
| 8 | 6 |
| all bits = 1 | 7 |

Bit 1 of the digital word is the least significant bit and bit 8 of the digital word is the most significant bit. The address "7" corresponds to the situation in which all bits on output 7 of the analog-to-digital converter 6 have the logic value "1", which in most cases indicates that the range of converter 6 is exceeded. In the address-logic circuit 10, this situation is treated separately and therefore this circuit is also connected to the line 7.

When a speech signal is being applied, a control signal is fed to a memory 12 via the line 11, which signal initiates a read-write cycle in this memory upon each pulse of a clock signal, not shown. This clock signal for example has a period of 1.7 ms or a frequency of approximately 600 Hz and upon each clock signal, the storage location of the memory 12 addressed by the address-logic circuit 10 is read out via the line 13 and the contents is inter alia applied to an input of an adder 14, whose other input continuously receives the digital value "1" and whose output is connected to the data input of the memory 12. Thus, upon each clock signal the contents of the storage location of the memory 12 being addressed is incremented by 1 and re-entered. In this way each storage location corresponds to a range of amplitude values of the signal on line 3, and at the end of the speech-signal input, the contents of the storage locations of the memory 12 indicate how many times the amplitude of the speech signal on the line 3 occurred within each one of the separate amplitude ranges, i.e. the memory 12 contains the histogram of the amplitude values of the speech signal received via the line 3.

Upon termination of the speech signal, when the signal on the line 11 changes, the address-logic circuit 10 addresses the storage location 7 in memoory 12, which indicates the frequency for the first amplitude range and consequently the number of times that the range of the analog-to-digital converter 6 has been exceeded. This frequency value $h_1$ is applied to a comparator 16 via the line 13, which comparator 16 compares the value $h_1$ with a constant multi-bit word $C_1$. If the value on the line 13 is greater than the constant $C_1$, i.e. if the analog-to-digital converter 6 has been overloaded many times, the comparator 16 produces a signal on the output line 17, which signal shifts the contents of a shift register 26 by one bit.

The output 27 of the shift register 26 inter alia controls the switches 36 in the amplifier 4. Suitably, the shift register 26 contains a logic value "1" at one position only, so that only the switch 36 corresponding to this position is closed. If the signal on the line 17 has shifted this value "1" in the shift register 26 by one position, another switch 36 is closed, which, through a suitable dimensioning of the corresponding resistors 34 and 35, reduces the gain of the amplifier 4 by the factor 2.

When the gain of the amplifier 4 is reduced, a new speech signal is applied, the frequencies $h_i$ are determined again, and $h_1$ is again compared with $C_1$ in the comparator 16. If again $h_1 > C_1$, the reduction of the gain, the application of a signal, the determination of the histogram, and the comparison of $h_1$ with $C_1$ is repeated until $h_1 \leq C_1$.

If after one or more repetitions $h_1 \leq C_1$, the gain of the amplifier 4 is optimum and on the line 17a a signal appears, which terminates the process.

Specifically for use in speech or speaker recognition devices, the arrangement in addition comprises a memory 28, an OR-gate 30 and a discriminator circuit 33. Only if $h_1 > C_1$ after an application of a signal (so that a signal appears on the line 17 and is not only applied to the shift register 26 but also to the discriminator circuit 33) and $h_1 \leq C_1$ after the next application of a signal (so that a signal appears on the line 17a and is also applied to the discriminator circuit 39), does a signal appear on the output of the discriminator circuit 33, which signal is applied to the write input of the memory 28 via the OR-gate 30. Since the output of the shift register 26 is connected to the data input of the memory 28, the contents of the shift register 26 is loaded into the memory 28. In order to save storage capacity in the memory 28, the data input of the memory 28 may be preceded by a code converter, which converts the number of the location at which the bit of the value "1" is present in the shift register 26 into a binary number. Alternatively, the shift register 26 may be replaced by an up-down counter.

The location or address in the memory 28 into which the contents of the shift register 26 is loaded is transferred via the line 29, which in reality also comprises a plurality of lines. This address is derived from a code word which is specific of a speaker, which is entered by the speaker before the first application of the speech signal, and which may be for example a code number which is keyed in. When the speaker enters this code word the value stored at the corresponding address in the memory 28 is read out and transferred to the shift register 26 via the line 31, in which register it forms the initial value, which upon the next application of the speech signal may be corrected and stored again, so as to be available for subsequent processing of a speech signal from the same speaker.

If upon the first application of the signal the value read from address "7" of the memory 12 and applied via the line 13 is equal to or smaller than the constant $C_1$, the comparator 16 produces an output signal on the line 17a. Apparently, the analog-to-digital converter 6 is not out of range. Now no signal appears on the output of the discriminator circuit 33. The signal on the line 17a is applied to the address-logic circuit 10 via the OR-gate 24, which circuit 10 generates the address "6", for example via a counter, which address is applied to the memory 12. The contents of this storage location of the memory 12, i.e. $h_2$ (the frequency for the second amplitude range), is again fed out via the line 13 and applied to an accumulator 20, which is started by the signal on the line 17a and which stores the value $h_2$. If $h_{2;l} \leq c_2$, one or more of the following values representing the frequencies in the successive next highest following amplitude ranges are produced on the line 13 and accumulated, as will be explained hereinafter. After the read-out of the contents of address "6" in the memory 12, only the value $h_2$ is contained in the accumulator 20 and appears on the output line 21, which in fact also comprises a plurality of lines for the parallel transfer of a digital word.

This digital word is applied to a further comparator 18, where it is compared with another constant word $C_2$. If the value of the digital word on the line 21 exceeds the constant $C_2$ (which means that the amplifier has already an optimum setting) the comparator 18 generates a signal on the line 19a, which via the OR-gate 30 is applied to the write input of the memory 28, so that the condition of the shift register 26 is stored at an address of the memory 28 which is determined by the signals on the line 29. Now the process is finished.

However, if the value $h_2$ is smaller than or equal to $C_2$, the comparator 18 produces a signal on the output line 19, which signal shifts the contents of the shift register 26 in the other direction. Thus, a corresponding other switch 36 in the amplifier 4 is energized and the gain is increased by the factor 2. Simultaneously the signal on the line 19 is applied to the address logic circuit 10 via the OR-circuit 24, so that the next lower address is generated and applied to the memory 12. The content $h_3$ at this address is also applied to the accumulator 20 via the line 13, where it is added to the value already contained in this accumulator 20. If the sum thus formed does not yet exceed the constant $C_2$, the comparator 18 again produces a signal on the line 19 and the contents of the shift register 26 is shifted again and the gain is increased again, while in the address-logic circuit 10, the next lower address is determined. This process is repeated until the sum formed in the accumulator exceeds the constant $C_2$. The comparator 18 then generates a signal on the line 19a, which via the OR-circuit 30 is applied to the write input of the memory 28, so that the last state assumed by the shift register 26 is stored in the memory 28 at the address which is specified by the signals on the line 29. Now the process of determining the optimum gain has terminated.

Before use and at the locations which have not yet been addressed via the line 29, the memory 28 contains a specific average value entered before use of the entire circuit arrangement shown in the FIG. 2. As a result of this, the amplifier is then set to an average gain. In the normal situation this gain will be so low that when the arrangement is used for the first time by a new speaker, a plurality of pulses may appear on the line 19, which shift the contents of the shift register 26 by a plurality of steps and thereby increase the gain several times by the factor 2. However, if a speaker has already made at least one speech test, the last optimum gain setting is stored at the corresponding address in the memory 28. This optimum gain value will not change substantially between two consecutive speech tests by the same speaker, so that after the first speech test, a correction by more than one step is unlikely.

This preliminary information about the signal amplitude enables the program loop comprising the blocks 120', 130', 140', 150' and 160' in FIG. 1 to be dispensed with. This is, because it is now known that in the event of overloading (when it has been determined in block 150 that $h_1 > C_1$) no more overloading will occur after one reduction of the gain A in block 160. Via the line 280 (and as the case may be via block 190) the program then proceeds directly to block 200.

The arrangement shown in FIG. 2 may be modified in that the discriminator circuit 33 is dispensed with and the line 17 is connected directly to the input of the OR-gate 30. Thus, if the comparator 16 detects that $h_1 > C_1$ a signal will appear on the line, which signal not only causes the shift register 26 to be shifted so as to reduce the gain, but also causes this reduced gain value to be stored in the memory 28.

The circuit arrangement described may readily be integrated in a semiconductor body. Alternatively, the arrangement may be constructed by means of a microprocessor. For example the OR-circuits 24 and 30 are then replaced by signal interrogations and the functions of the comparator 16 and 18 and those of the adder 14 and a part of the address-logic circuit 10 may be performed by the arithmetic unit of the microprocessor. In this way the circuit arrangement described in the foregoing can be constructed with a minimum number of parts.

What is claimed is:

1. A method of controlling the gain of an amplifier, in which method a signal is applied to the amplifier and the output signal therefrom is digitized in an analog-to-digital converter; characterized in that the method comprises the steps:

(a) setting the amplifier gain to an initial value;
    (b) inputting a sample of said digitized output signal for a predetermined period of time;
    (c) deriving a histogram from said signal sample, said histogram representing the frequency with which the amplitude of said signal sample occurs in each of different consecutive amplitude ranges;
    (d) comparing the frequency of occurrences in the highest amplitude range with a predetermined first constant;
    (e) reducing the present value of the amplifier gain by a predetermined first factor, storing this reduced value and terminating the method if said frequency of occurrences exceeds said first constant;
    (f) comparing the frequency of occurrences in the second highest amplitude range with a predetermined second constant;
    (g) storing the present value of the amplifier gain and terminating said method if said frequency of occurrences exceeds said second constant;
    (h) raising the present value of the amplifier gain by a predetermined second factor if said frequency of occurrences does not exceed said second constant;
    (i) forming a sum of the frequencies of occurrences of said second and a third highest amplitude ranges;
    (j) comparing said sum of frequencies with said second constant;
    (k) storing the present value of the amplifier gain and terminating said method if said sum exceeds said second constant;
    (l) raising the present value of the amplifier gain by said predetermined second factor if said sum does not exceed said second constant;
    (m) adding the frequency of occurrences in a next highest amplitude range to said sum; and
    (n) repeating steps (j)–(m) until the sum exceeds said second constant.

2. A method as claimed in claim 1, characterized in that each time step (e) is carried out, the sequence of steps returns to step (b) using the gain resulting from the gain reduction performed in that step (e) as the specific initial setting of the amplifier gain in the new step (b), and wherein the method is terminated when it is found in a repeated step (d) resulting from such a return that the frequency value for the highest amplitude range obtained in the immediately preceding step (c) does not exceed the first constant.

3. A method as claimed in claim 2, wherein the signal applied to the amplifier is a speech signal originating from a specific speaker, characterized in that either after the step (e), when step (d) is carried out only once, or when it is found in a repeated step (d) that the frequency value for the first amplitude range obtained in the immediately preceding step (c) does not exceed the first constant, or when it is found in the step (f) that the frequency value for the second highest amplitude range exceeds the second constant, or when it is found in the step (j) that the second constant is exceeded by the resulting sum which is compared therewith, a quantity representative of the gain setting then present is stored in a memory at a location assigned to the specific speaker.

4. A method as claimed in claim 1, 2 or 3, characterized in that the lower limits of each pair of consecutive amplitude ranges differ by a factor two and wherein said predetermined second factor is equal to two.

5. A method as claimed in claim 1, characterized in that the first factor is equal to the second factor.

6. An arrangement for controlling the gain of an amplifier, characterized in that the arrangement comprises:

a discriminator coupled to an output of said amplifier which, each time the amplitude of a signal on said amplifier output occurs in various amplitude ranges, produces different incrementing signals;
    a first accumulator coupled to said discriminator which comprises a first memory, having storage locations which correspond respectively to said various amplitude ranges and which increments by one unit the contents of the storage location corresponding to the amplitude range in which the incrementing signal is situated;
    a first comparator coupled to said first accumulator for comparing the contents of a first storage location in said first accumulator, which contents corresponds to the frequency of occurrences of signal amplitudes in a highest of said various amplitude ranges, with a first constant and if this first constant is exceeded, changes the contents of a gain-control memory so as to reduce the gain of said amplifier; and
    coupled to said first accumulator and said first comparator which, if the first constant is not exceeded, transfers the contents of the second storage location in said first accumulator, which corresponds to the frequency of occurrences of signal amplitudes in a second highest amplitude range or the sum of the contents of the second and ensuing storage locations, to a second comparator for comparison with a second constant;
    after a comparison which indicates that at least the contents of the second storage location has not exceeded the second constant, the second comparator changing the contents of the gain-control memory so as to increase the gain, an output of the gain-control memory being connected to a control input of the amplifier for the application of a control signal.

7. An arrangement as claimed in claim 6 for use in a speaker identification system, characterized in that the arrangement further comprises a second memory which serves to take over the contents of the gain-control memory in a storage location assigned to the respective speaker.

8. An arrangement as claimed in claim 7, characterized in that before the next application of a speech signal from the same speaker, the second memory transfers the contents of the storage location assigned to the speaker to the gain-control memory as the initial gain setting.

9. An arrangement as claimed in claim 6, 7 or 8, characterized in that the discriminator comprises an analog-to-digital converter and consecutive amplitude ranges are defined by consecutive bits of the output signal of the analog-to-digital converter.

* * * * *

UNITED STATES PATENT AND TRADEMARK OFFICE
CERTIFICATE OF CORRECTION

PATENT NO. : 4,543,537

DATED : September 24, 1985

INVENTOR(S) : MICHAEL H. KUHN ET AL

It is certified that error appears in the above-identified patent and that said Letters Patent is hereby corrected as shown below:

Claim 6, line 24, before "coupled" insert --a second accumulator--

Signed and Sealed this

Twenty-second Day of July 1986

[SEAL]

Attest:

DONALD J. QUIGG

Attesting Officer

Commissioner of Patents and Trademarks